United States Patent
Dimaano, Jr. et al.

(10) Patent No.: US 8,536,689 B2
(45) Date of Patent: Sep. 17, 2013

(54) INTEGRATED CIRCUIT PACKAGE SYSTEM WITH MULTI-SURFACE DIE ATTACH PAD

(75) Inventors: Antonio B. Dimaano, Jr., Singapore (SG); Il Kwon Shim, Singapore (SG); Sheila Rima C. Magno, Singapore (SG); Dennis Guillermo, Singapore (SG)

(73) Assignee: Stats Chippac Ltd., Singapore (SG)

( * ) Notice: Subject to any disclaimer, the term of this patent is extended or adjusted under 35 U.S.C. 154(b) by 1041 days.

(21) Appl. No.: 11/163,035

(22) Filed: Oct. 3, 2005

(65) Prior Publication Data

US 2007/0075404 A1 Apr. 5, 2007

(51) Int. Cl.
*H01L 23/495* (2006.01)
*H01L 21/44* (2006.01)

(52) U.S. Cl.
USPC .......... 257/676; 257/666; 257/784; 257/787; 257/E23.037; 438/123; 438/124; 438/127; 438/617

(58) Field of Classification Search
USPC .............. 438/111, 112, 106, 123, 124, 617; 257/666, 607, 676, 784, 787, E23.037
See application file for complete search history.

(56) References Cited

U.S. PATENT DOCUMENTS

| | | | |
|---|---|---|---|
| 5,506,425 A | 4/1996 | Whitney et al. | 257/177 |
| 5,637,913 A * | 6/1997 | Kajihara et al. | 257/666 |
| 5,818,103 A * | 10/1998 | Harada | 257/676 |
| 5,874,773 A * | 2/1999 | Terada et al. | 257/676 |
| 6,166,430 A | 12/2000 | Yamaguchi | 257/666 |
| 6,433,424 B1 | 8/2002 | Sammon | 257/735 |
| 6,642,609 B1 * | 11/2003 | Minamio et al. | 257/666 |
| 6,683,368 B1 * | 1/2004 | Mostafazadeh | 257/676 |
| 6,828,661 B2 * | 12/2004 | Araki et al. | 257/676 |
| 6,870,245 B1 | 3/2005 | Schatzler et al. | 257/669 |
| 6,909,168 B2 * | 6/2005 | Minamio et al. | 257/670 |
| 7,227,245 B1 * | 6/2007 | Bayan et al. | 257/666 |
| 8,410,585 B2 * | 4/2013 | Ahn et al. | 257/666 |
| 2001/0009301 A1 * | 7/2001 | Azuma | 257/698 |
| 2002/0084518 A1 * | 7/2002 | Hasebe et al. | 257/676 |
| 2005/0007890 A1 * | 1/2005 | Bertrand et al. | 368/294 |
| 2005/0029638 A1 * | 2/2005 | Ahn et al. | 257/676 |
| 2005/0236701 A1 * | 10/2005 | Minamio et al. | 257/676 |
| 2007/0052070 A1 * | 3/2007 | Islam et al. | 257/666 |

* cited by examiner

*Primary Examiner* — Nitin Parekh
(74) *Attorney, Agent, or Firm* — Ishimaru & Associates LLP

(57) ABSTRACT

An integrated circuit package system is provided including an integrated circuit package system including an integrated circuit and a lead frame. The lead frame has a multi-surface die attach pad and the integrated circuit is mounted to the multi-surface die attach pad.

20 Claims, 4 Drawing Sheets

INTEGRATED CIRCUIT PACKAGE SYSTEM WITH MULTI-SURFACE DIE ATTACH PAD

TECHNICAL FIELD

The present invention relates generally to integrated circuit package systems, and more particularly to a system for integrated circuit package with multi-surface die attach pad.

Background Art

An integrated circuit die is a small device formed on a semiconductor wafer, such as a silicon wafer. Such an integrated circuit die is typically cut from the wafer and attached to a substrate or base carrier for redistribution of interconnects. Bond pads on the integrated circuit die are then electrically connected to the leads on the carrier via wire bonding. The integrated circuit die and wire bonds are encapsulated with a protective material such that a package is formed. The leads encapsulated in the package are redistributed in a network of conductors within the carrier and end in an array of terminal points outside the package. The terminal points allow the integrated circuit die to be electrically connected with other circuits, such as on a printed circuit board. An IC can also be attached to another IC to form a stacked multichip device.

Broad use of an IC has extended the needs for reliability and performance beyond even recent expectations. Many forms of IC find their way into consumer electronics, such as portable personal electronics, cell phones, digital cameras, music players, PDA's, and location-based devices. Some may argue that this is the most demanding of all electronics systems. Here the IC can be subjected to the full range of human environments and conditions. This can span negative temperatures, triple digit temperatures, water, altitude, high force impacts and repetitive stress. Manufacturing methods need to accommodate both fabrication extremes as well as application or usage extremes. Stresses often result in damage to the IC, such as delaminating, corrosion, and breakage. This damage causes failures that are sometimes intermittent and hard to detect or analyze.

Thus a need still remains for an integrated circuit package system to ensure that the manufacturing methods provide increasing reliability and performance. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including an integrated circuit and a lead frame. The lead frame has a multi-surface die attach pad and the integrated circuit is mounted to the multi-surface die attach pad.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
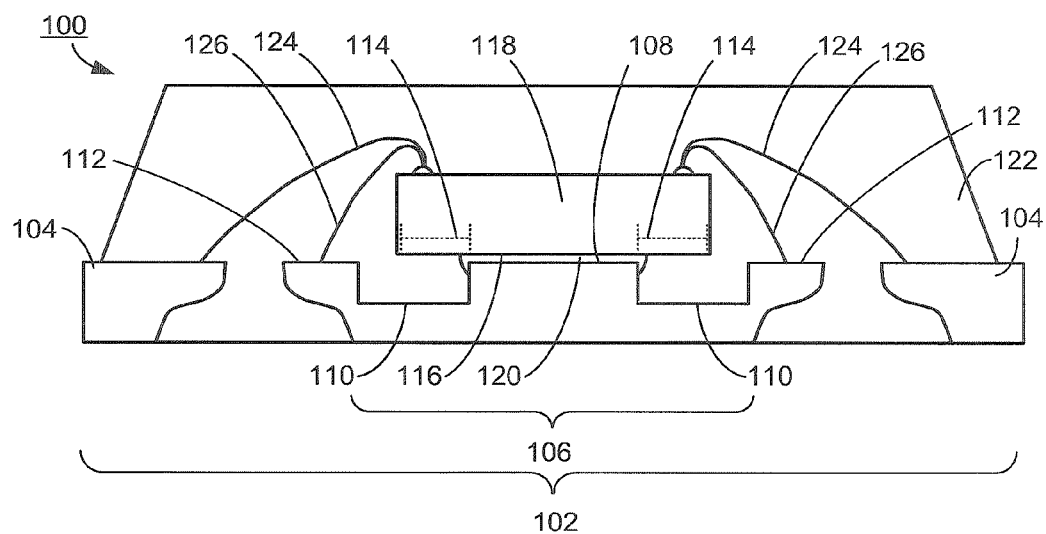
FIG. 1 is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known circuits, package configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGS. Similarly, although the sectional views in the drawings for ease of description show the integrated circuits with mounted surfaces as oriented downward, this arrangement in the FIGS. is arbitrary and is not intended to suggest that the integrated circuits should necessarily be attached in a downward direction. Generally, the device can be operated in any orientation. The same numbers are used in all the drawing FIGS. to relate to the same elements.

The term "horizontal" as used herein is defined as a plane parallel to the conventional plane or surface of the lead frame, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in an embodiment of the present invention. The integrated circuit package system 100 includes a lead frame 102 having a plurality of leads 104 and a multi-surface die attach pad 106. The multi-surface die attach pad 106 includes a configured and raised mounting surface 108, a depressed recess surface 110, and a set of raised bonding surfaces 112. The configured and raised mounting surface 108 is surrounded by the depressed recess surface 110, which is larger than an integrated circuit die 118, and is surrounded by a set of raised bonding surfaces 112. The multi-surface die attach pad 106 includes a first non-horizontal side facing a second non-horizontal side. The first non-horizontal side is directly under the integrated circuit die 118 and extends from the configured and raised mounting surface 108 to the depressed recess surface 110. The second non-horizontal side is horizontally outside a perimeter of the integrated circuit die 118 and extends from the depressed recess surface 110 to one of the raised bonding surfaces 112.

For illustrative purposes the mounting surface 108, the recess surface 110, and the set of bonding surfaces 112 are shown in the same horizontal plane, although it is understood that the mounting surface 108, the recess surface 110, and the set of bonding surfaces 112 may be in different horizontal planes, as well.

The recess surface 110 provides an exposed region 114 on a mounting side 116 of an integrated circuit 118. The exposed region 114 is at the periphery of the integrated circuit 118 and provides relief for the overflow of an adhesive 120, wherein the adhesive 120 thickness may be easily controlled. The adhesive 120 may be conductive or non-conductive, as well. The exposed region 114 further provides a large wettable surface for adhesion of a mold compound 122 for encapsulating the integrated circuit 118, a plurality of bond wires 124, and a set of down bond wires 126. The mold compound 122 is directly on the exposed region 114 and the depressed recess surface 110 laterally extends beyond the exposed region 114. Yet further, the recess surface 110 provides a flow path for the mold compound 122.

The plurality of bond wires 124 provides electrical connection of the integrated circuit 118 to the plurality of leads 104. Similarly, the set of down bond wires 126 provides additional electrical connection of the integrated circuit 118 to the set of bonding surfaces 112.

For illustrative purposes the integrated circuit 118 is shown electrically connected to the lead frame 102 using wire bonding, although it is understood that any other electrical connection material, method or process may be used, as well. Further, it is understood that any number of bond wires may be used, as well.

Figure 2:
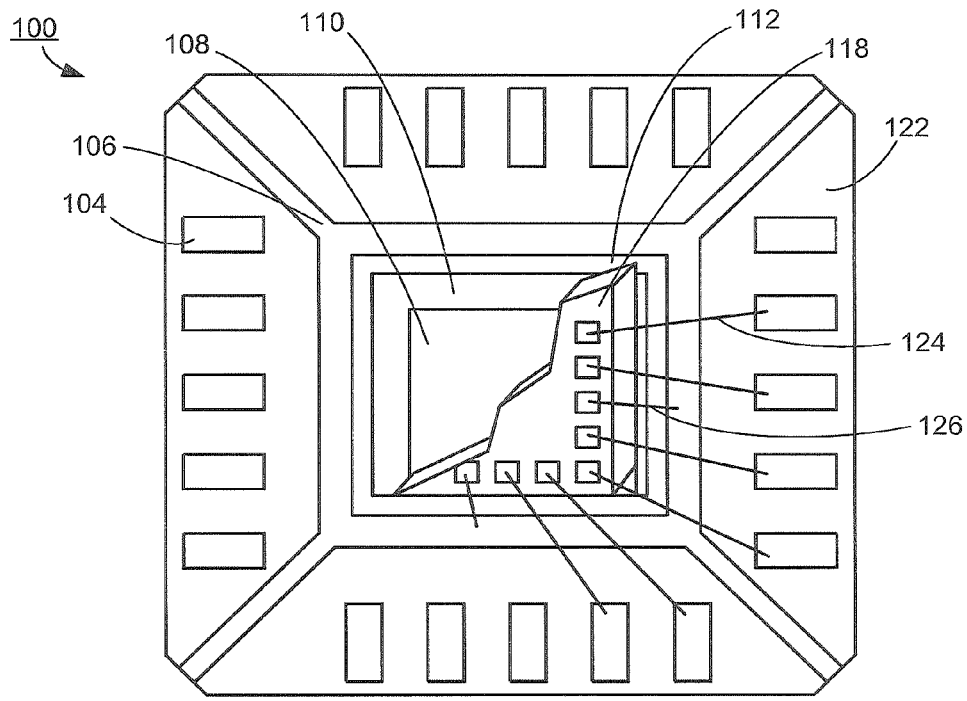
FIG. 2 is a top cut-away view of the integrated circuit package system as shown in FIG. 1.

Referring now to FIG. 2, therein is shown a top cut-away view of the integrated circuit package system 100 as shown in FIG. 1. The cut-away of the mold compound 122 provides an unobstructed view of the set of bonding surfaces 112, one of the set of down bond wires 126, the plurality of leads 104, the plurality of bond wires 124, and the integrated circuit 118, mounted.

For illustrative purposes, the plurality of leads 104 is shown with a specific quantity of leads, although it is understood that the quantity of leads may be different, as well. Further, for illustrative purposes, the plurality of bond wires 124 and the set of down bond wires 126 are shown with a specific quantity, although it is understood that the quantity may be different, as well. Yet further, for illustrative purposes, the integrated circuit 118 is shown with a specific quantity of connections, although it is understood that the quantity of connections may be different, as well.

The partial cut-away of the integrated circuit 118 provides a partially unobstructed top view of the mounting surface 108 and the recess surface 110. A partial view of the integrated circuit 118 is shown mounted to the mounting surface 108 whereon the exposed region 114 is implied. The exposed region 114 is formed since a planar dimension of the mounting surface 108 is designed to be smaller than a planar dimension of the integrated circuit 118. Part of the recess surface 110 is also visible beyond an extent of the integrated circuit 118.

For illustrative purposes the recess surface 110 is shown without the mold compound 122, although it is understood the mold compound 122 conforms and adheres to the recess surface 110 and the exposed region 114.

Figure 3:
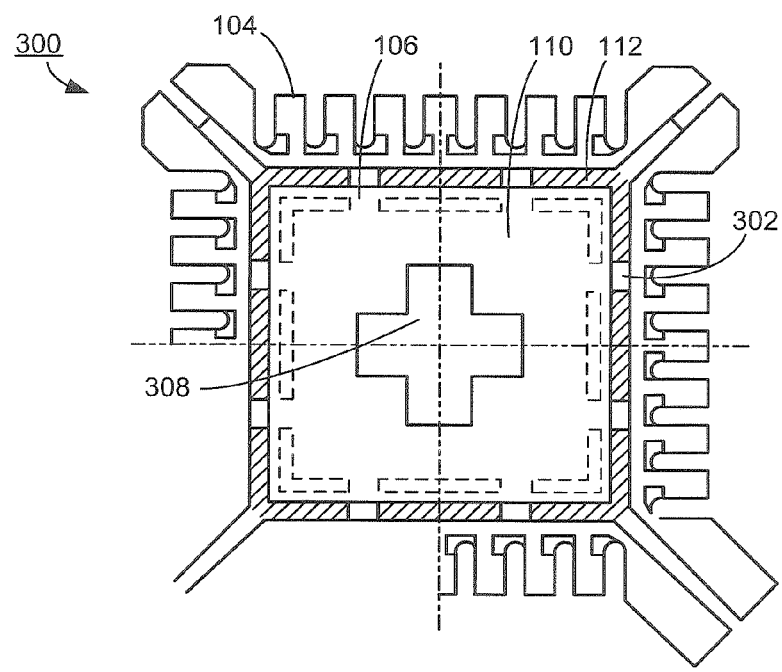
FIG. 3 is a top plan view of the integrated circuit package system in an alternate embodiment of the present invention.

Referring now to FIG. 3, therein is shown a top plan view of the integrated circuit package system 300 in an alternate embodiment of the present invention. A mounting surface 308 is shown in a configuration in the form of a cross rather than a square as in FIG. 1 and FIG. 2. The form of the cross extends towards the sides of the lead frame 102. Further, the lead frame 102 is shown having a trench 302 to provide flow and adhesion for the mold compound 122. Yet further, the lead frame 102 may have a dual etch feature for the purpose of interlocking, as well.

Figure 4:
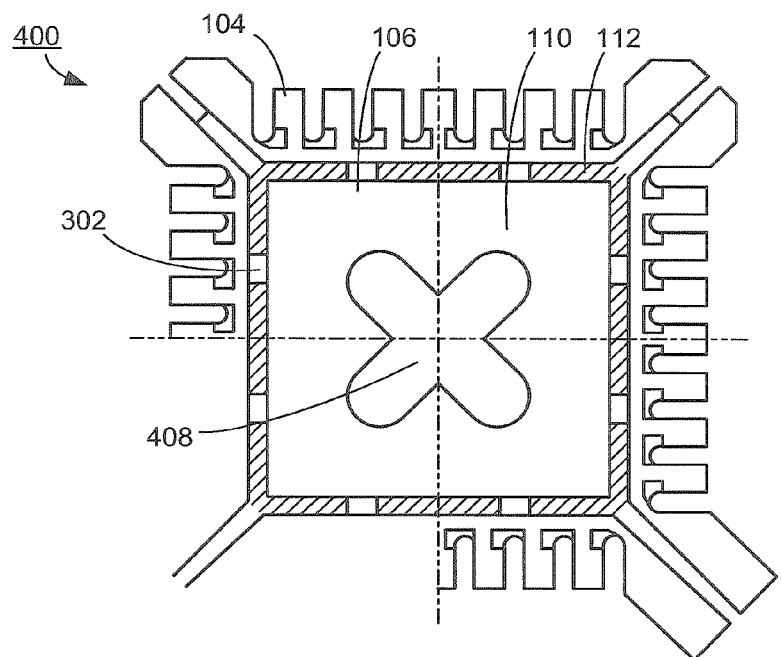
FIG. 4 is a top plan view of the integrated circuit package system in yet another embodiment of the present invention.

Referring now to FIG. 4, therein is shown a top plan view of the integrated circuit package system 400 in yet another embodiment of the present invention. A mounting surface 408 is shown in a configuration in the form of an "X" rather than the square as in FIG. 1 and FIG. 2. The form of the "X" extends towards the lead frame 102 corners.

Figure 5:
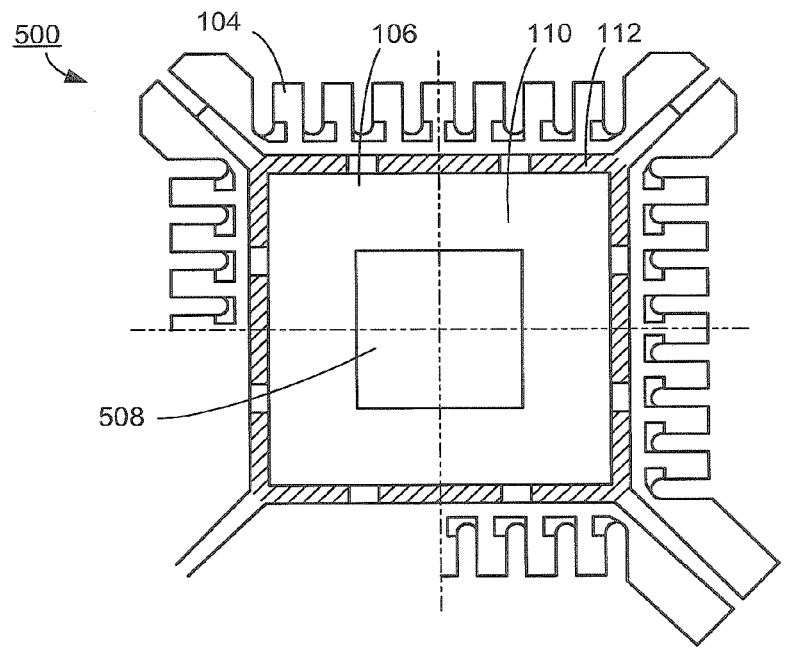
FIG. 5 is a top plan view of the integrated circuit package system in yet another embodiment of the present invention.

Referring now to FIG. 5, therein is shown a top plan view of the integrated circuit package system 500 in yet another embodiment of the present invention. A mounting surface 508 is shown in a configuration in the form of the square as in FIG. 1 and FIG. 2. The form of the square can also take the form of a circle (not shown).

Figure 6:
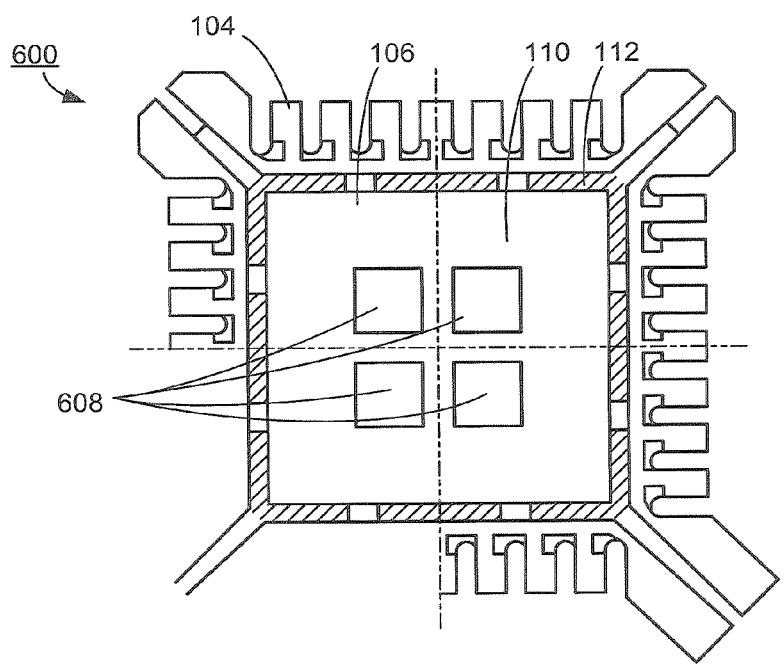
FIG. 6 is a top plan view of the integrated circuit package system in yet another embodiment of the present invention.

Referring now to FIG. 6, therein is shown a top plan view of the integrated circuit package system 600 in yet another embodiment of the present invention. A mounting surface 608 is shown in four individual squares arranged in a square-like shape rather than the square as in FIG. 1 and FIG. 2. The four square-like shapes can also take the form of circles (not shown). The four individual shapes may be separated on all sides providing additional trenches.

Figure 7:
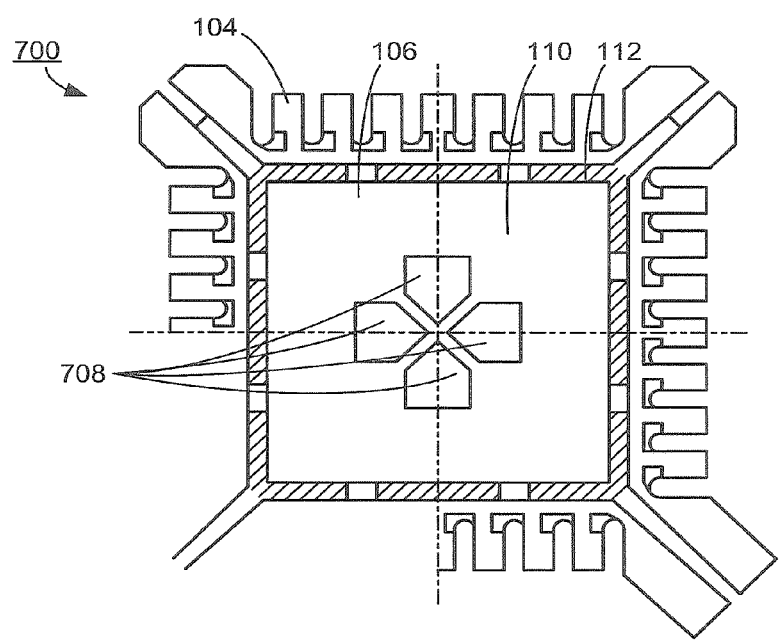
FIG. 7 is a top plan view of the integrated circuit package system in yet another embodiment of the present invention.

Referring now to FIG. 7, therein is shown a top plan view of the integrated circuit package system 700 in yet another embodiment of the present invention. A mounting surface 708 is shown in a configuration in the form of a plurality of squares in the form of a square rather than the square as in FIG. 1 and FIG. 2. The four individual shapes extend towards the sides of the lead frame 102. The four individual shapes may be separated on all sides providing additional trenches.

Figure 8:
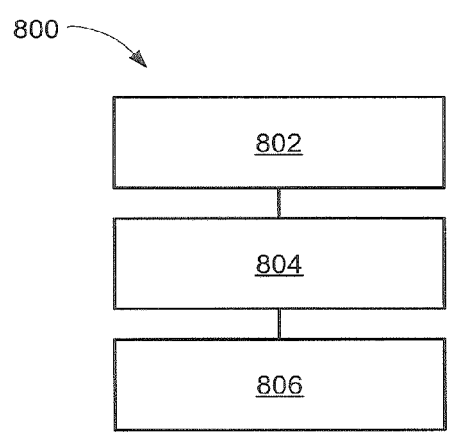
FIG. 8 is a flow chart of a system for an integrated circuit package in an embodiment of the present invention.

Referring now to FIG. 8, therein is shown a flow chart of a system 800 for an integrated circuit package in an embodiment of the present invention. The system 800 includes providing an integrated circuit in a block 802; providing a lead frame having a multi-surface die attach pad in a block 804; and mounting the integrated circuit to the multi-surface die attach pad in a block 806.

In greater detail, a method to fabricate the integrated circuit package system 100, according to an embodiment of the present invention, is performed as follows:

(1) 1. The mounting surface 108, the recess surface 110, and the set of bonding surfaces 112 are formed by an etching process, such as half etch and multi-etch, applied to the multi-surface die attach pad 106 of the lead frame 102. (FIG. 1)

(2) 2. The mounting surface 108 of the multi-surface die attach pad 106 is formed such that the planar dimension of the mounting surface 108 is smaller than the planar dimension of the smallest allowable of the integrated circuit 118. (FIG. 1)

(3) 3. The mold compound 122 conforms and adheres to the integrated circuit 118 mounted to the lead frame 102 including a recess formed between the integrated circuit 118 and the multi-surface die attach pad 106. (FIG. 1)

It has been discovered that the present invention thus has numerous advantages.

An advantage is that the present invention improves the integrated circuit package reliability and performance. The improvement in the fabrication methods, manufacturing processes and product yields result from several advantages of the present invention. Improving the reliability and performance results in a reduction of scrap and more importantly failures in higher level systems, particularly those in the field.

It has been discovered that the disclosed structure results in reduced delamination of the die attach pad and integrated circuit. The improved adhesion and mold flowability provide additional and desired die coverage.

It has also been discovered that the disclosed structure provides improvements with the die attach process window. The elimination of persistent overflow issues allows the bond line thickness to be easily controlled.

Yet another discovery of the disclosed structure is improvements in the moisture sensitivity level. The improved molding conformance and adherence provide a decreased susceptibility to damage or failures due to moisture.

Yet another discovery of the disclosed structure is a wider range of allowable integrated circuit die sizes. The reduced sensitivity to the difference between integrated circuit die size and die attach pad size eliminates many size restrictions.

These and other valuable aspects of the present invention consequently further the state of the technology to at least the next level.

Thus, it has been discovered that the integrated circuit package system 100 method and apparatus of the present invention furnish important and heretofore unknown and unavailable solutions, capabilities, and functional advantages for integrated circuit packages. The resulting processes and configurations are straightforward, cost-effective, uncomplicated, highly versatile and effective, can be implemented by adapting known technologies, and are thus readily suited for efficiently and economically manufacturing integrated circuit package devices. The resulting processes and configurations are straightforward, cost-effective, uncomplicated, highly versatile, accurate, sensitive, and effective, and can be implemented by adapting known components for ready, efficient, and economical manufacturing, application, and utilization.

The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit packaging method comprising:
providing a multi-surface die attach pad having a raised mounting surface surrounded by a depressed recess surface surrounded by a raised bonding surface;
attaching a mounting side of an integrated circuit on the raised mounting surface with the raised bonding surface surrounding the integrated circuit, the mounting side having an exposed region at a periphery of the integrated circuit over the depressed recess surface; and
forming a mold compound in direct contact with the exposed region at the periphery of the integrated circuit and over the depressed recess surface and the depressed recess surface extending laterally beyond the exposed region.

2. The method as claimed in claim 1 wherein forming the mold compound includes filling a recess between the integrated circuit and the multi-surface die attach pad.

3. The method as claimed in claim 1 further comprising forming the raised mounting surface of the multi-surface die attach pad includes forming a planar dimension of the raised mounting surface smaller than a planar dimension of the integrated circuit.

4. The method as claimed in claim 1 further comprising electrically connecting the integrated circuit to the raised bonding surface of the multi-surface die attach pad and a plurality of leads of a lead frame.

5. The method as claimed in claim 1 wherein mounting the integrated circuit to the multi-surface die attach pad further comprises a layer of adhesive, bonding the integrated circuit to the multi-surface die attach pad.

6. An integrated circuit packaging method comprising:
providing a lead frame having a multi-surface die attach pad having a configured and raised mounting surface surrounded by a depressed recess surface surrounded by a raised bonding surface;
attaching a mounting side of an integrated circuit on the configured and raised mounting surface with the raised bonding surface surrounding the integrated circuit, the mounting side having an exposed region at a periphery of the integrated circuit over the depressed recess surface; and
forming a mold compound in direct contact with the exposed region at the periphery of the integrated circuit and over the depressed recess surface and the depressed recess surface extending laterally beyond the exposed region.

7. The method as claimed in claim 6 wherein the configured and raised mounting surface of the multi-surface die attach pad further comprises a configuration in the form of a cross or a plurality of polygons combined to form a cross-like shape.

8. The method as claimed in claim 6 wherein the configured and raised mounting surface of the multi-surface die attach pad further comprises a configuration in the form of a square or a plurality of squares combined to form a square-like shape.

9. The method as claimed in claim 6 wherein the configured and raised mounting surface of the multi-surface die attach pad further comprises a configuration in the form of a circle or a plurality of circles.

10. The method as claimed in claim 6 wherein the configured and raised mounting surface of the multi-surface die attach pad further comprises a configuration in the form of an "X".

11. An integrated circuit package system comprising:
a multi-surface die attach pad having a raised mounting surface surrounded by a depressed recess surface surrounded by a raised bonding surface;
a mounting side of an integrated circuit on the raised mounting surface with the raised bonding surface surrounding the integrated circuit, the mounting side having an exposed region at a periphery of the integrated circuit over the depressed recess surface; and
a mold compound in direct contact with the exposed region at the periphery of the integrated circuit and over the depressed recess surface and the depressed recess surface extending laterally beyond the exposed region.

12. The system as claimed in claim 11 wherein the mold compound fills a recess between the integrated circuit and the multi-surface die attach pad.

13. The system as claimed in claim 11 wherein the raised mounting surface of the multi-surface die pad includes a planar dimension of the raised mounting surface smaller than a planar dimension of the integrated circuit.

14. The system as claimed in claim 11 wherein the integrated circuit is electrically connected to the raised bonding surface of the multi-surface die attach pad and a plurality of leads of a lead frame.

15. The system as claimed in claim 11 wherein the integrated circuit mounted to the multi-surface die attach pad further comprises a layer of adhesive whereon the integrated circuit and the multi-surface die attach pad are bonded.

16. An integrated circuit package system comprising:
a lead frame having a multi-surface die attach pad having a configured and raised mounting surface surrounded by a depressed recess surface surrounded by a raised bonding surface;
a mounting side of an integrated circuit on the configured and raised mounting surface with the raised bonding surface surrounding the integrated circuit, the mounting side having an exposed region at a periphery of the integrated circuit over the depressed recess surface; and
a mold compound in direct contact with the exposed region at the periphery of the integrated circuit and over the depressed recess surface and the depressed recess surface extending laterally beyond the exposed region.

17. The system as claimed in claim 16 wherein the configured and raised mounting surface of the multi-surface die attach pad further comprises a configuration in the form of a cross or a plurality of polygons formed in a cross-like shape.

18. The system as claimed in claim 16 wherein the configured and raised mounting surface of the multi-surface die attach pad further comprises a configuration in the form of a square or a plurality of squares formed in a square-like shape.

19. The system as claimed in claim 16 wherein the configured and raised mounting surface of the multi-surface die attach pad further comprises a configuration in the form of a circle or a plurality of circles.

20. The system as claimed in claim 16 wherein the configured and raised mounting surface of the multi-surface die attach pad further comprises a configuration in the form of an "X".

* * * * *